(12) United States Patent
Walsh et al.

(10) Patent No.: US 10,965,894 B2
(45) Date of Patent: Mar. 30, 2021

(54) SHORT WAVE INFRARED IMAGE SENSOR WITH AUTOMATIC EXPOSURE AND DYNAMIC RANGE CONTROL

(71) Applicant: FLIR Commercial Systems, Inc., Goleta, CA (US)

(72) Inventors: Devin T. Walsh, Goleta, CA (US); Gary Miller, Lompoc, CA (US); Thomas Troy Stark, Lompoc, CA (US); Tadashi Horikiri, Santa Barbara, CA (US); Marinus C. DeJong, Goleta, CA (US); Darren M. Haley, Santa Barbara, CA (US)

(73) Assignee: FLIR Commercial Systems, Inc., Goleta, CA (US)

( * ) Notice: Subject to any disclaimer, the term of this patent is extended or adjusted under 35 U.S.C. 154(b) by 0 days.

(21) Appl. No.: 16/182,504

(22) Filed: Nov. 6, 2018

(65) Prior Publication Data

US 2019/0158769 A1    May 23, 2019

Related U.S. Application Data

(60) Provisional application No. 62/588,879, filed on Nov. 20, 2017.

(51) Int. Cl.
*H04N 5/361* (2011.01)
*H01L 27/146* (2006.01)
*H04N 5/376* (2011.01)
*H04N 5/3745* (2011.01)
*H04N 5/378* (2011.01)
*H01L 31/0304* (2006.01)
*H04N 5/33* (2006.01)
(Continued)

(52) U.S. Cl.
CPC ....... *H04N 5/361* (2013.01); *H01L 27/14649* (2013.01); *H01L 31/03046* (2013.01); *H04N 5/2353* (2013.01); *H04N 5/243* (2013.01); *H04N 5/33* (2013.01); *H04N 5/378* (2013.01); *H04N 5/3745* (2013.01); *H04N 5/3765* (2013.01)

(58) Field of Classification Search
CPC .................................................... H04N 5/361
See application file for complete search history.

(56) References Cited

U.S. PATENT DOCUMENTS 8,149,326 B2 * 4/2012 Olsen .................. H04N 5/2352
                                                          348/229.1
8,687,110 B1    4/2014 Gardner
9,554,059 B1 * 1/2017 Lin ..................... H04N 5/35554
(Continued)

*Primary Examiner* — James M Hannet
(74) *Attorney, Agent, or Firm* — Haynes and Boone, LLP

(57) ABSTRACT

A system comprises an image sensor comprising an array of infrared sensors operable to capture an image of a scene, an integration timing circuit variably controlling an integration time of the infrared sensors, a readout integrated circuit (ROIC) operable to generate signals from the infrared sensors corresponding to the captured image of the scene, and an automatic gain control operable to applied a gain to the generated signals. The system further comprises a dynamic range compensation controller operable to receive image parameters corresponding to the generated signals, compare the received image parameters to target image parameters, and generate an integration timing signal for controlling the integration timing circuit.

20 Claims, 14 Drawing Sheets

(51) Int. Cl.
*H04N 5/243* (2006.01)
*H04N 5/235* (2006.01)

(56) References Cited

U.S. PATENT DOCUMENTS

| | | | |
|---|---|---|---|
| 2005/0270412 A1* | 12/2005 | Kamon | H04N 5/235 |
| | | | 348/362 |
| 2006/0001748 A1* | 1/2006 | Kamon | H04N 5/35509 |
| | | | 348/234 |
| 2014/0247985 A1* | 9/2014 | Park | G06T 5/40 |
| | | | 382/170 |
| 2014/0355892 A1* | 12/2014 | Moon | G06K 9/6215 |
| | | | 382/220 |
| 2015/0222816 A1* | 8/2015 | Shohara | H04N 5/235 |
| | | | 348/38 |
| 2017/0142311 A1* | 5/2017 | Kurata | G03B 15/00 |
| 2018/0131884 A1* | 5/2018 | Nishikawa | H04N 5/2355 |
| 2019/0068865 A1* | 2/2019 | Guerin | G06T 5/008 |

* cited by examiner

SHORT WAVE INFRARED IMAGE SENSOR WITH AUTOMATIC EXPOSURE AND DYNAMIC RANGE CONTROL

CROSS REFERENCE TO RELATED APPLICATIONS

This application claims the benefit of and priority to U.S. Provisional Patent Application No. 62/588,879 filed Nov. 20, 2017 and entitled "SHORT WAVE INFRARED IMAGE SENSOR WITH AUTOMATIC EXPOSURE AND DYNAMIC RANGE CONTROL," which is incorporated herein by reference in its entirety.

STATEMENT REGARDING FEDERALLY SPONSORED RESEARCH AND DEVELOPMENT

This invention was made in part with government support under contract #FA8650-14-C-5508, awarded by the United States Air Force. The United States Government may have certain rights in and to this invention.

TECHNICAL FIELD

One or more embodiments of the present disclosure relate generally to infrared imaging devices and more particularly, for example, to optimization of signal to noise performance in short wave infrared imaging devices.

BACKGROUND

There are a wide variety of image detectors, such as visible image detectors, infrared image detectors, or other types of image detectors that may be provided in an image detector array for capturing an image. As an example, a plurality of sensors may be provided in an image detector array to detect electromagnetic radiation at desired wavelengths. Such detectors may be connected to or part of unit cells in a read out integrated circuit (ROIC) which capture image data in response to the detected radiation and then communicate that image data to external electronics. The combination of a detector array with an ROIC is known either as a focal plane array (FPA) or an image sensor. Advances in process technology for FPAs and image processing have led to increased capabilities and sophistication of resulting imaging systems. Many imaging applications such as short wave infrared (SWIR) face challenges when imaging scenes having a large dynamic range. A SWIR camera, for example, may operate from low light conditions with a photon flux of mid $10^{11}$ (ph/cm$^2$s) up to daylight conditions of mid $10^{15}$ (ph/cm$^2$s). There is a continued need in the art for more efficient, accurate and higher quality imaging systems for use across a range of imaging environments.

SUMMARY

Various techniques are provided for implementing a short wave infrared image sensor with automatic exposure and dynamic range control. In various embodiments, a system comprises an image sensor and a dynamic range compensation controller. The image sensor may comprise an array of infrared sensors (e.g., a short wave infrared image sensor) operable to capture an image of a scene, an integration timing circuit variably controlling an integration time of the infrared sensors, a readout integrated circuit (ROIC) operable to generate signals from the infrared sensors corresponding to the captured image of the scene, and an automatic gain controller operable to apply a gain to the generated signals. The dynamic range compensation controller may be operable to receive image characteristics corresponding to the generated signals, compare the received image characteristics to target image characteristics, and adjust an integration timing signal for controlling the integration timing circuit to align the received image characteristics with the target image characteristics.

In some embodiments, the image characteristics comprise a received image histogram and a target image histogram and the dynamic range compensation controller is operable to adjust the integration timing signal to align the received image histogram to the target image histogram. In one embodiment, the dynamic range compensation controller includes a peak mode wherein the received image histogram is adjusted to align a top of the received image histogram with a top of the target histogram. In another embodiment, the dynamic range compensation controller includes an average mode wherein the received image histogram is adjusted to align a mean of the received image histogram with a mean of the target histogram. The dynamic range compensation controller may also comprise an automatic exposure control (AEC) module operable to adjust the integration timing signal, and a gain control module operable to generate a gain control signal for controlling the automatic gain controller. The AEC module may be operable to detect whether the integration timing signal is equal to or below a minimum integration threshold, and wherein the gain control module is operable to adjust the gain control signal to an available lower gain mode if the image characteristics and the target image characteristic are not aligned, and detect whether the integration timing signal is equal to or above a maximum integration threshold, and wherein the gain control module is operable to adjust the gain control signal to a higher gain mode when the image characteristics and the target image characteristic are not aligned.

In various embodiments, the dynamic range compensation controller is further operable to calculate a step size based on the comparison between the received image characteristics and the target image characteristics and wherein the integration timing signal is adjusted by applying the step size to a current integration timing signal. The dynamic range compensation controller may further a state machine operable to perform the automatic exposure control.

In various embodiments, a method comprises capturing an image of a scene using an array of infrared sensors (e.g., short wave infrared image sensors), variably controlling an integration time of the infrared sensors using an integration timing circuit, generating signals from the infrared sensors corresponding to the captured image of the scene using a readout integrated circuit (ROIC), applying a gain to the generated signals, using an automatic gain controller; and compensating for a dynamic range of the image using a dynamic range controller, including receiving image characteristics corresponding to the generated signals, comparing the received image characteristics to target image characteristics, and generating an integration timing signal for controlling the integration timing.

In some embodiments, the image characteristics may comprise a received image histogram and a target image histogram and the integration timing signal is adjusted to align the received image histogram to the target image histogram. In various embodiments, the adjustment of the integration timing signal may comprise operating in a peak mode wherein the received image histogram is adjusted to align a top of the received image histogram with a top of the target histogram, or an average mode wherein the received image histogram is adjusted to align a mean of the received image histogram with a mean of the target histogram. The integration timing signal may be adjusted using an automatic exposure control (AEC) module, and a gain control signal may be generated for controlling the automatic gain controller. The integration timing signal may be adjusted by generating a step size based on the comparison between the received image characteristics and the target image characteristics and adjusting the integration timing signal by applying the step size to a current integration timing signal.

The method may further comprise detecting whether the integration timing signal is equal to or below a minimum integration threshold, and adjusting the gain control signal to an available lower gain mode if the received image characteristics and the target image characteristic are not aligned, and detecting whether the integration timing signal is equal to or above a maximum integration threshold, and adjusting the gain control signal to a higher gain mode when the image characteristics and the target image characteristic are not aligned.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

Figure 1:
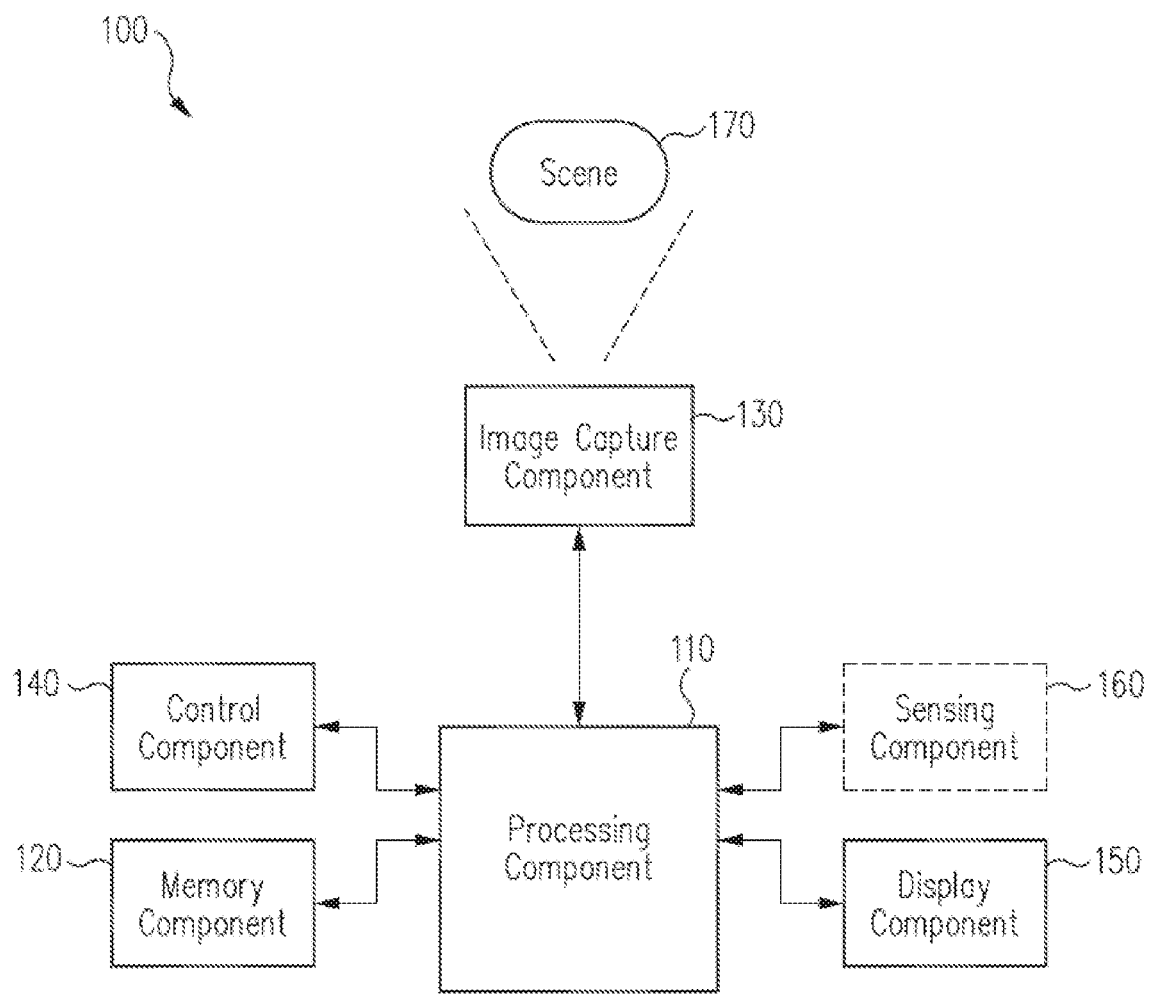
FIG. 1 illustrates an example imaging system in accordance with an embodiment of the disclosure.

Various embodiments for implementing a short wave infrared image sensor with automatic exposure and dynamic range control are disclosed herein. Referring to FIG. 1, a block diagram of a system (e.g., an imaging system such as an infrared camera) for capturing and processing images in accordance with one or more embodiments will now be described. System 100 comprises, in one implementation, a processing component 110, a memory component 120, an image capture component 130, a control component 140, and/or a display component 150. System 100 may further include a sensing component 160.

System 100 may represent, for example, an imaging system such as an infrared imaging device, or a multi-band imaging device for capturing and processing images, such as video images of a scene 170. In some embodiments, system 100 may represent any type of infrared camera adapted to detect infrared radiation and provide representative data and information (e.g., infrared image data of a scene) or may represent more generally any type of electro-optical sensor system. As examples, system 100 may represent an infrared camera, a dual band imager such as a night vision imager that operates to sense reflected visible and/or short-wave infrared (SWIR) light for high resolution images and long-wave infrared (LWIR) radiation for thermal imaging, or an imager for sensing both short wave and long wave radiation simultaneously for providing independent image information. System 100 may comprise a portable device and may be incorporated, e.g., into a vehicle (e.g., hand-held devices, an automobile or other type of land-based vehicle, an aircraft, a marine craft, or a spacecraft) or a non-mobile installation requiring infrared images to be stored and/or displayed or may comprise a distributed networked system.

In various embodiments, processing component 110 may comprise any type of a processor or a logic device (e.g., a programmable logic device (PLD) configured to perform processing functions). Processing component 110 may be adapted to interface and communicate with components 120, 130, 140, and 150 to perform method and processing steps and/or operations, as described herein such as controlling biasing and other functions (e.g., values for elements such as variable resistors and current sources, switch settings for timing such as for switched capacitor filters, ramp voltage values, etc.) along with conventional system processing functions as would be understood by one skilled in the art.

Memory component 120 comprises, in one embodiment, one or more memory devices adapted to store data and information, including for example infrared data and information. Memory device 120 may comprise one or more various types of memory devices including volatile and non-volatile memory devices. Processing component 110 may be adapted to execute software stored in memory component 120 so as to perform method and process steps and/or operations described herein.

Image capture component 130 comprises, in one embodiment, any type of image sensor, such as, for example, an image sensor having one or more image detector elements such as infrared photodetector elements (e.g., any type of multi-pixel infrared detector, such as a focal plane array as described hereinafter) for capturing infrared image data (e.g., still image data and/or video data) representative of an scene such as scene 170. If desired, image capture component 130 may include one or more arrays of other detector elements such as uncooled detector elements (e.g., uncooled microbolometer sensors), cooled detector elements (e.g., detector elements such as photovoltaic or quantum structure elements that are cooled using a cryogen coupled to the array or using a refrigeration system), InSb detector elements, quantum structure detector elements, InGaAs detector elements, or other types of sensors.

In one implementation, image capture component 130 may be configured to generate digital image data representing incoming image light from scene 170. Image capture component 130 may include one or more signal processing components such as analog-to-digital converters included as part of an infrared sensor or separate from the infrared sensor as part of system 100. In one aspect, infrared image data (e.g., infrared video data) may comprise non-uniform data (e.g., real image data) of a scene such as scene 170. Processing component 110 may be adapted to process the infrared image data (e.g., to provide processed image data), store the infrared image data in memory component 120, and/or retrieve stored infrared image data from memory component 120. For example, processing component 110 may be adapted to process infrared image data stored in memory component 120 to provide processed image data and information (e.g., captured and/or processed infrared image data).

Control component 140 comprises, in one embodiment, a user input and/or interface device. For example, the user input and/or interface device may represent a rotatable knob (e.g., potentiometer), push buttons, slide bar, keyboard, etc., that is adapted to generate a user input control signal. Processing component 110 may be adapted to sense control input signals from a user via control component 140 and respond to any sensed control input signals received therefrom. Processing component 110 may be adapted to interpret such a control input signal as a parameter value, as generally understood by one skilled in the art.

In one embodiment, control component 140 may comprise a control unit (e.g., a wired or wireless handheld control unit) having push buttons adapted to interface with a user and receive user input control values. In one implementation, the push buttons of the control unit may be used to control various functions of the system 100, such as autofocus, menu enable and selection, field of view, brightness, contrast, noise filtering, high pass filtering, low pass filtering, and/or various other features as understood by one skilled in the art.

In one embodiment, control component 140 may optionally include temperature control components for cooling or heating an image sensor. Temperature control components may include a container such as a Dewar containing a cryogenic liquid and a thermally conductive coupling member coupled between the cryogenic liquid and a sensor structure on which an array of detectors is formed. However, this is merely illustrative. If desired, image capture component 130 may be an uncooled image capture component.

Display component 150 comprises, in one embodiment, an image display device (e.g., a liquid crystal display (LCD) or various other types of generally known video displays or monitors). Processing component 110 may be adapted to display image data and information on the display component 150. Processing component 110 may be adapted to retrieve image data and information from memory component 120 and display any retrieved image data and information on display component 150. Display component 150 may comprise display electronics, which may be utilized by processing component 110 to display image data and information (e.g., infrared images). Display component 150 may be adapted to receive image data and information directly from image capture component 130 via the processing component 110, or the image data and information may be transferred from memory component 120 via processing component 110.

Sensing component 160 comprises, in one embodiment, one or more sensors of various types, depending on the application or implementation requirements, as would be understood by one skilled in the art. The sensors of optional sensing component 160 provide data and/or information to at least processing component 110. In one aspect, processing component 110 may be adapted to communicate with sensing component 160 (e.g., by receiving sensor information from sensing component 160) and with image capture component 130 (e.g., by receiving data and information from image capture component 130 and providing and/or receiving command, control, and/or other information to and/or from one or more other components of system 100).

In various implementations, sensing component 160 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 160 may represent conventional sensors as generally known by one skilled in the art for monitoring various conditions (e.g., environmental conditions) that may have an effect (e.g., on the image appearance) on the data provided by image capture component 130.

In some implementations, optional sensing component 160 (e.g., one or more of sensors) may comprise devices that relay information to processing component 110 via wired and/or wireless communication. For example, optional sensing component 160 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 100 may be combined and/or implemented or not, as desired or depending on the application or requirements, with system 100 representing various functional blocks of a related system. In one example, processing component 110 may be combined with memory component 120, image capture component 130, display component 150, and/or optional sensing component 160. In another example, processing component 110 may be combined with image capture component 130 with only certain functions of processing component 110 performed by circuitry (e.g., a processor, a microprocessor, a logic device, a microcontroller, etc.) within image capture component 130. Furthermore, various components of system 100 may be remote from each other (e.g., image capture component 130 may comprise a remote sensor with processing component 110, etc. representing a computer that may or may not be in communication with image capture component 130).

Figure 2:
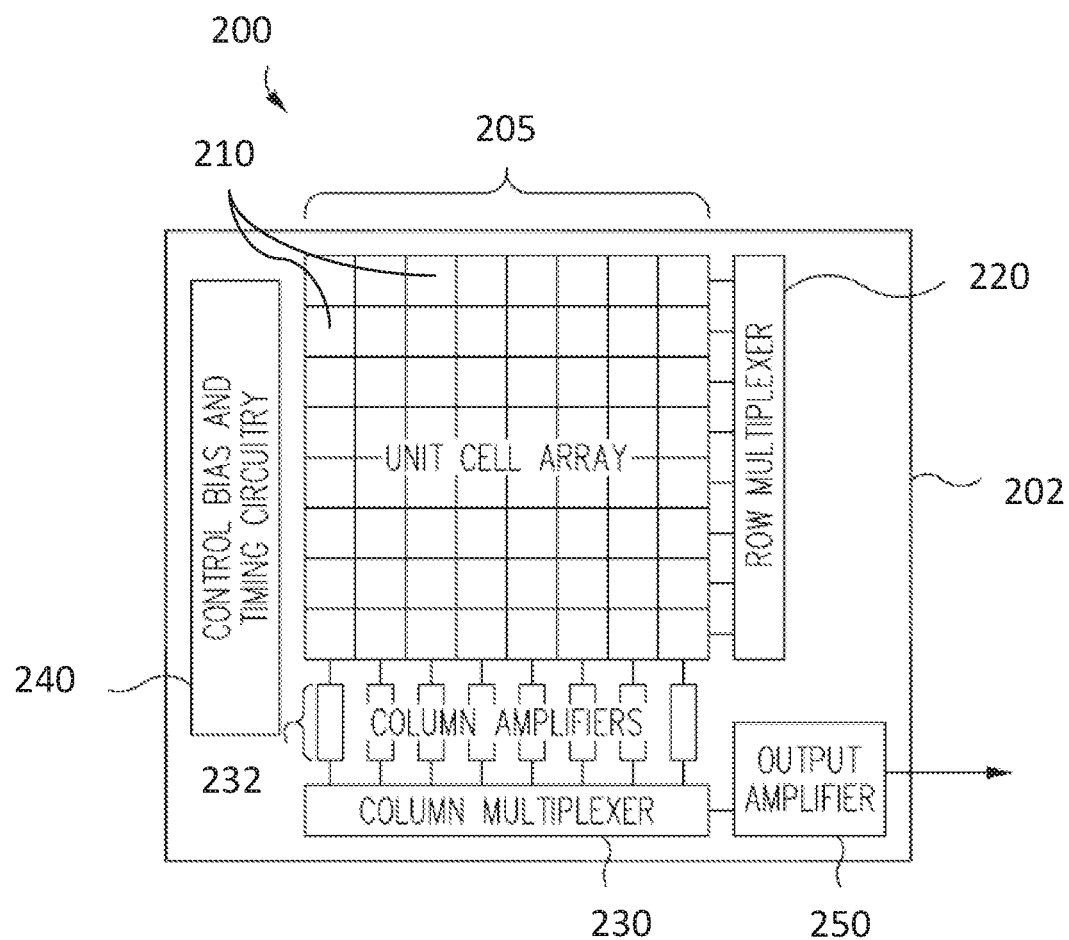
FIG. 2 illustrates a block diagram of an infrared sensor assembly including an array of infrared sensors in accordance with an embodiment of the disclosure.

FIG. 2 is a block diagram of an infrared sensor assembly 200 accordance with an embodiment of the invention. The infrared sensor assembly 200 may be a focal plane array, for example, implemented as an image sensor in image capture component 130 of FIG. 1.

In the illustrated embodiment, the infrared sensor assembly 200 includes an array of infrared sensors 205 provided as part of a unit cell array of a ROIC 202. The ROIC 202 includes bias generation and timing control circuitry 240, column amplifiers 232, a column multiplexer 230, a row multiplexer 220, and an output amplifier 250. Image frames (e.g., thermal images) captured by infrared sensors 205 may be provided by output amplifier 250 to processing component 110 and/or any other appropriate components to perform various processing techniques described herein.

Although an 8 by 8 array is shown in FIG. 2, any desired array configuration may be used in other embodiments.

The infrared sensor assembly 200 may capture images (e.g., image frames) and provide such images from its ROIC 202 at various rates. In some embodiments, each unit cell 210 may be configured to integrate and readout image signals generated by detectors in multiple detector rows. In this type of configuration, a single unit cell 210 may be used to integrate charges, during multiple integration times, from multiple detectors, including detectors associated with other unit cells 210. For example, a unit cell 210 in a first row may be used to integrate image charges from its associated detector and from one or more detectors in adjacent detector rows.

Processing component 110 may be used to perform appropriate processing of captured infrared images and may be implemented in accordance with any appropriate architecture. In one embodiment, processing component 110 may be implemented as an ASIC. In this regard, such an ASIC may be configured to perform image processing with high performance and/or high efficiency. In another embodiment, processing component 110 may be implemented with a general purpose central processing unit (CPU) which may be configured to execute appropriate software instructions to perform image processing, coordinate and perform image processing with various image processing blocks, coordinate interfacing between processing component 110 and a host device, and/or other operations. In yet another embodiment, processing component 110 may be implemented with a field programmable gate array (FPGA). Processing module 110 may be implemented with other types of processing and/or logic circuits in other embodiments as would be understood by one skilled in the art.

In these and other embodiments, processing component 110 may also be implemented with other components where appropriate, such as, volatile memory, non-volatile memory, and/or one or more interfaces (e.g., infrared detector interfaces, inter-integrated circuit (I2C) interfaces, mobile industry processor interfaces (MIPI), joint test action group (JTAG) interfaces (e.g., IEEE 1149.1 standard test access port and boundary-scan architecture), and/or other interfaces).

One or more control circuits may be provided as part of and/or separate from infrared sensor assembly 200 to provide various signals further described herein. Such control circuits may be implemented in accordance with any appropriate control circuits such as one or more processors (e.g., processing components 110), logic, clocks, and/or other circuits as may be desired for particular implementations. In various embodiments, the components of the system 100 and/or infrared imaging module 200 may be implemented as a local or distributed system with components in communication with each other over wired and/or wireless networks. Accordingly, the various operations identified in this disclosure may be performed by local and/or remote components as may be desired in particular implementations.

Figure 3:
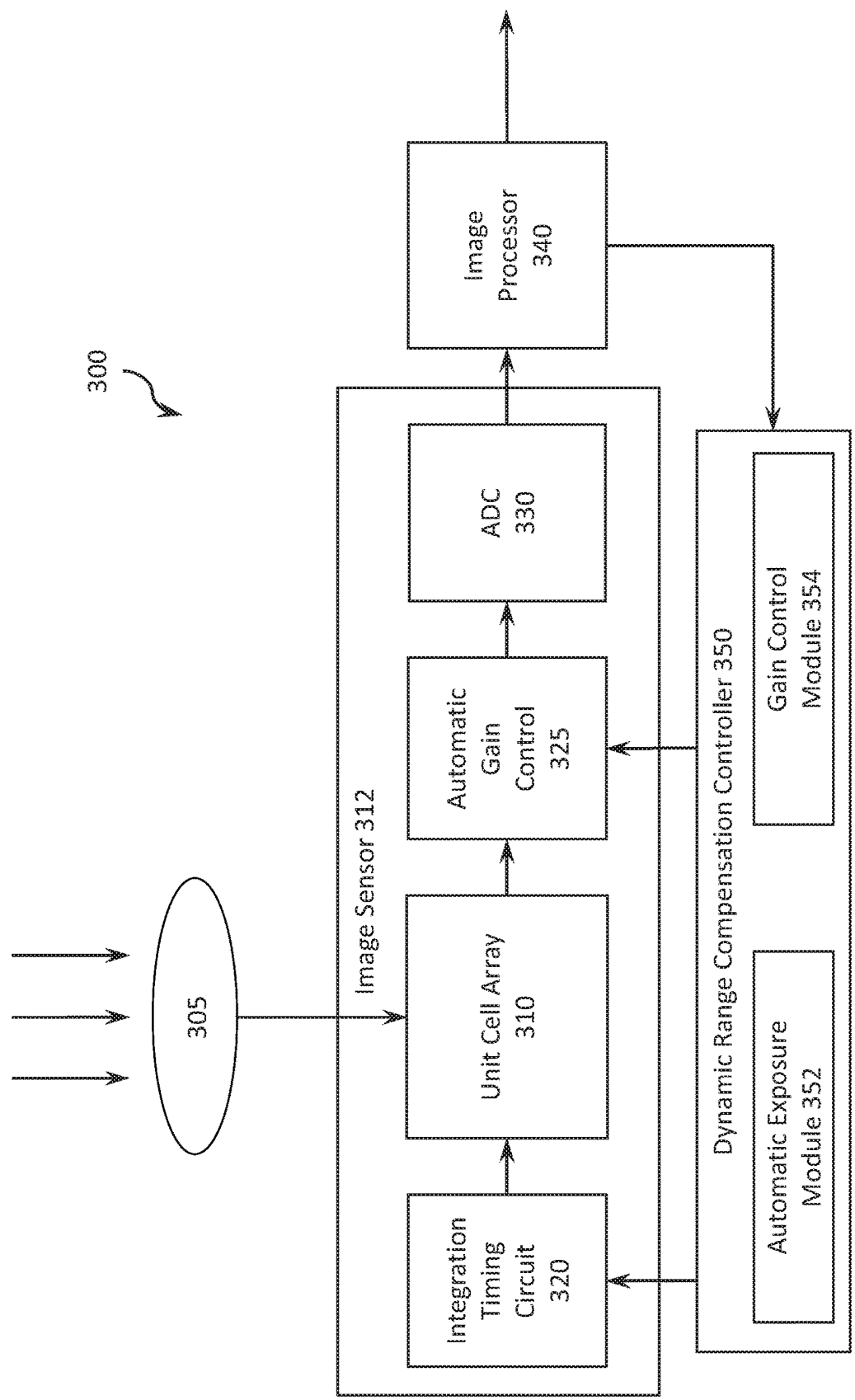
FIG. 3 is a block diagram of an infrared imaging device in accordance with an embodiment of the disclosure.

Referring to FIG. 3, an infrared image device 300, such as a SWIR camera, is illustrated in accordance with an embodiment of the present disclosure. Imaging device 300 includes a lens 305 focusing light onto a unit cell array 310 of an image sensor 312. It will be appreciated that image sensor 312 need not be limited to a SWIR image sensor but may comprise a visible light CMOS sensor or other suitable types of image sensors. An integration timing circuit 320 controls the integration of the light received by the image sensor 312 to generate an analog image signal. The analog image signal is gain adjusted through an automatic gain control (AGC) unit 325 and digitized in an analog-to-digital converter (ADC) 330. An image processor 340 processes the resulting raw digital signal from ADC 330 to produce the desired digitized image signal.

In various embodiments, during daylight operation, image sensor 312 may receive sufficient light such that AGC 325 need not activate. Automatic gain control 325 controls the gain applied to an input signal based upon feedback from the image processor 340 and dynamic range compensation controller 350. For example, each pixel in the digitized image from image processor 340 has some dynamic range— for example, if the dynamic range is 8 bits, each pixel value can range from zero to 255. The image would be completely saturated if each 8-bit pixel had a value of 255 and would be totally dark if each pixel had a value of zero. Thus, image processor 340 may provide a feedback reference signal to the dynamic range compensation controller 350 that represents an average pixel value. In various embodiments, the automatic gain control may be performed in the analog domain or in the digital domain.

In one mode of operation, during daylight the average pixel value received from the image processor 340 is provided to the AGC unit 325, which provides only a baseline amount of gain (such as through a variable gain amplifier). As daylight fades, the average pixel value drops below a desired reference value, whereupon a control signal is generated to increase the gain applied to input image signal. Conversely, as light intensity increases, the control signal would decrease the amount of gain applied to input signal.

It will be appreciated that automatic gain control could also occur in the digital domain. For example, a digital gain may be applied via a histogram stretching or other suitable technique on the digitized image. Histogram stretching may be applied, for example, to an underexposed image that would result from low-light conditions. The relatively weak image signal in such a case would occupy the lower part of the total dynamic range. For example, consider an example embodiment in which each image pixel has a dynamic range of 8 bits such that any given pixel has a digital value ranging from zero to 255. In a low-light condition without analog AGC, the relatively weak image signal may be such that a histogram for the pixel values shows that most of the pixels are concentrated in a low range such as from zero to 50. Histogram stretching may then be applied to increase image quality by better occupying the available dynamic range. The amount of histogram stretching that is applied may thus be considered as a digital gain. Regardless of where the gain is controlled, the amount of gain applied is responsive to some sort of control signal. The control signal thus serves as a proxy for determining whether external lighting conditions are such that the image sensor should be cooled.

Dynamic Range Control

The dynamic range compensation controller 350 includes an automatic exposure module 352 providing automatic exposure control (AEC) and a gain control module 354 that control the dynamic range using feedback from the image processor 340 to automatically control the sensor integration time and gain mode to optimize image signal to noise performance. In one embodiment, the infrared image device 300 is a SWIR camera and the unit cell array comprises an InGaAs detector. Imaging in the SWIR band is often challenging where scenes have large dynamic range. In a common mode of operation, a SWIR camera may operate from low light conditions with a photon flux of mid 1011(ph/cm2s) up to daylight conditions of mid 1015(ph/cm2s). The InGaAs detector can convert this photon flux to a current over the entire range, and this current is sampled and processed into a digital signal at the output of the image sensor 312 (e.g., a focal plane array integrated circuit). To provide a signal with good signal to noise characteristics, the readout integrated circuit of the image sensor 312 has a variable integration time, controlled through integration timing circuit 320, which is analogous to a shutter time. The illustrated embodiment also provides multiple gain modes (e.g., 3 gain modes) through the automatic gain control unit 325, which are analogous to a camera film speed. In various embodiments, when under low light conditions the integration time may be long and the gain may be set to high mode for best performance, and when the scene illumination is high (daylight) the integration time may be short and the gain may be set in a low mode.

In operation, the automatic exposure module 352 controls the integration time of the image sensor 312. In one embodiment, statistics of the current image of the image processor are measured and, based on the mean of the peak level of the image histogram distribution, the integration time is adjusted. The control loop operates continuously during AEC operation. As the scene gets darker the integration time is increased, or as the scene gets brighter the integration time is decreased. The control loop may have user inputs which control the image distribution setpoints, and the rate at which the algorithm approaches the setpoint. For example, user input options may include selection of a gain table, image information (e.g., mean image, image peak and image based values), integration information (e.g., target values), enable/disable of auto exposure and gain switch modes, integration time, gain mode settings, auto exposure settings and other user input options.

The gain control module 354 of the dynamic range compensation controller 350 controls the current gain state. In one embodiment, three gain states are available: high, medium and low. Each gain state has an optimum range of operation. Under low light conditions the AEC function will increase the integration time to the maximum attempting to achieve the defined operation point. If the integration time is maximized and the image histogram is still in the lower part of the range, the gain control module 354 will switch the gain state to a higher gain. Under bright conditions the automatic exposure module 352 will decrease the integration time to a minimum period attempting to achieve the defined operation point. If the integration time is minimized and a portion of the scene is still saturated, the gain control module 354 will switch the gain state to a lower gain.

Figure 4:
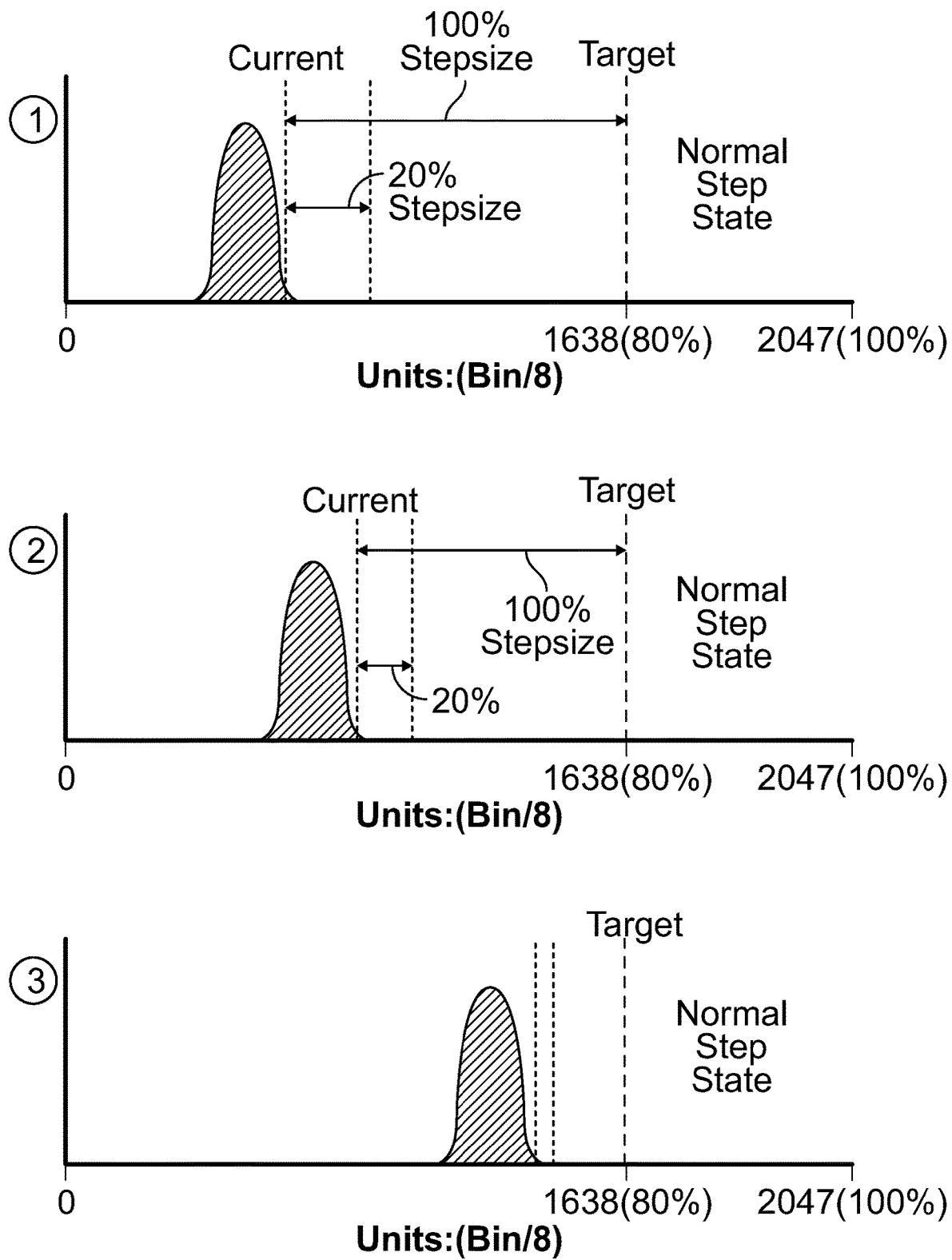
FIG. 4 illustrates an example scenario where an image histogram approaches an image target in accordance with an embodiment of the disclosure.
Figure 4:
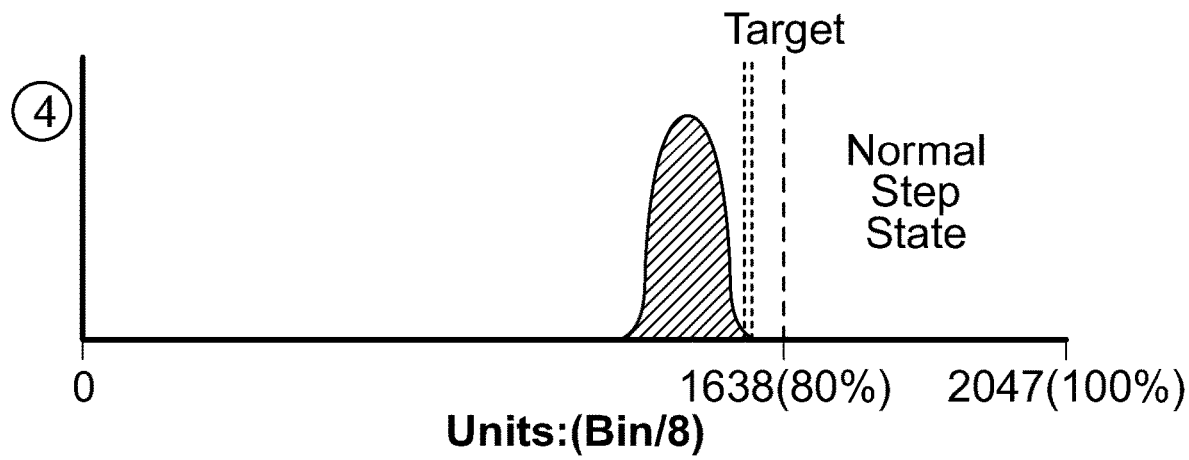
Figure 4:
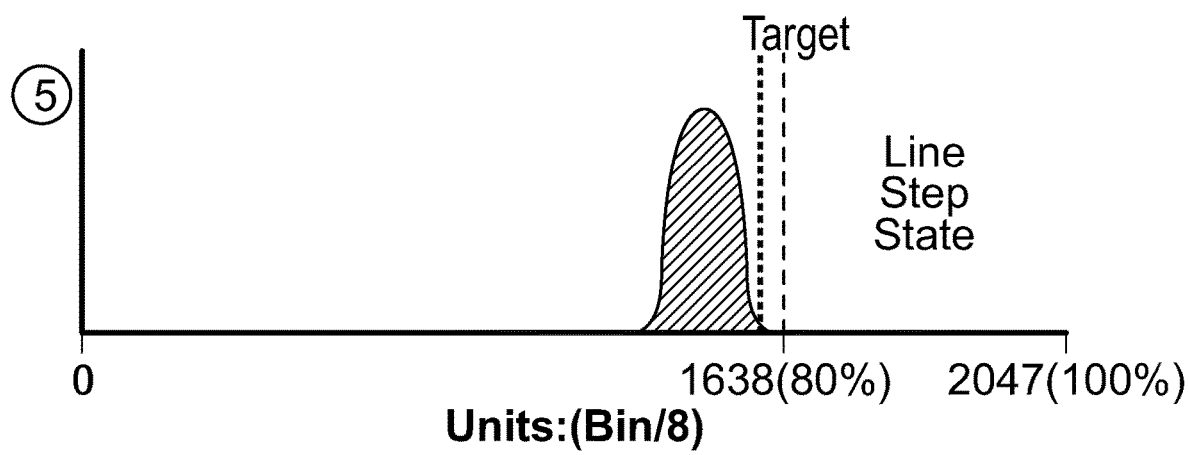
Figure 4:
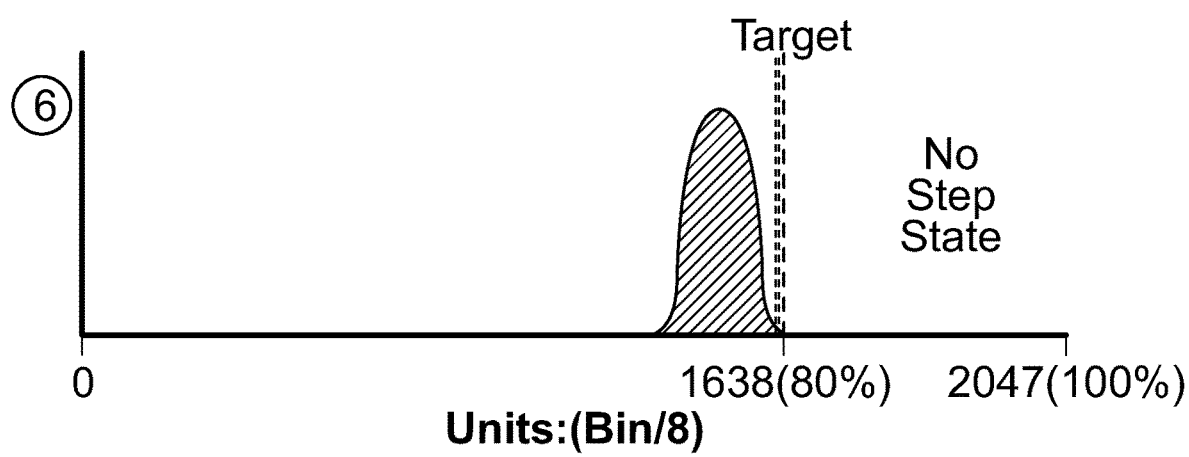

Referring to FIG. 4, an embodiment depicting an automatic exposure control scenario where the image histogram approaches the target from the left is illustrated. The AEC module 352 may run in a peak-mode or an average-mode in the illustrated embodiment. In peak mode, the AEC module 352 attempts to align the top of the histogram (the top-most bin in which pixels are populated) to the target value. The target value may be specified as a percentage of the maximum range. Bins may be measured in units of max-count/8, or 16383/8, for a total parameter range of 0 to 2047. In illustrated diagrams, the target for peak-mode is set to 80%, and given a target of 80% (i.e., 80% of 2047 is a target of 1638), the algorithm attempts to align the top-most bin populated with pixels to 1638.

In various embodiments, the AEC module 352 operates on a histogram which has been modified to remove outliers at the top and bottom of the distribution. For example, a head clip function may remove a percentage of the pixels at the top of the histogram, which are excluded from the AEC calculations, and a tail clip function may remove a percentage of the pixels at the bottom of the histogram, which are excluded from the AEC calculations. The gain control module 354 becomes active when the AEC module cannot align the histogram, and parameters are set to prevent excessive switching between gain modes (e.g., low, medium, high). For example, if the current scene parameter (image mean intensity or image peak intensity) is less than the target value, then the integration time is increased to make the scene brighter. If the current scene parameter is greater than the target value, then the integration time is decreased to make the scene darker.

In one embodiment, the adjustment in integration time is made by determining a stepsize and applying the step size to the current integration time. For example, the next step size may be calculated as a maximum step size (e.g., maximum percentage change of intensity) times the difference between the target value and the current image parameters. The step size is then applied to the current integration time. The new integration time is then provided to the integration timing circuit to control the integration time of the sensor array.

As shown in FIG. 4, since the next step is calculated to be 20% of the difference between current and target, for a stationary target, each step size becomes progressively smaller. In one embodiment, this asymptotic approach is complicated by the fact that in order to ensure that no undesirable artefacts are introduced into the video, the image sensor controller does not allow arbitrary values to be written into the integration time register of the image sensor. That is, the AEC module calculates a target integration time and requests the change by calling the image sensor controller. But, image sensor controller enforces an effective granularity on the actual setting it makes to this parameter. If the AEC module's calculated step-size becomes less than this granularity, the image sensor controller rounds the integration time down to a setting that conforms to the granularity. Under these circumstances, from the AEC Module's perspective, the net effect is that this leaves the integration time unchanged. Unless something is done about this, the algorithm will continue to try to move the next step towards the target, fail, retry, fail, etc. In order to overcome this limitation, a state machine is maintained to ensure that the scene statistics converge to the desired target.

Figure 5:
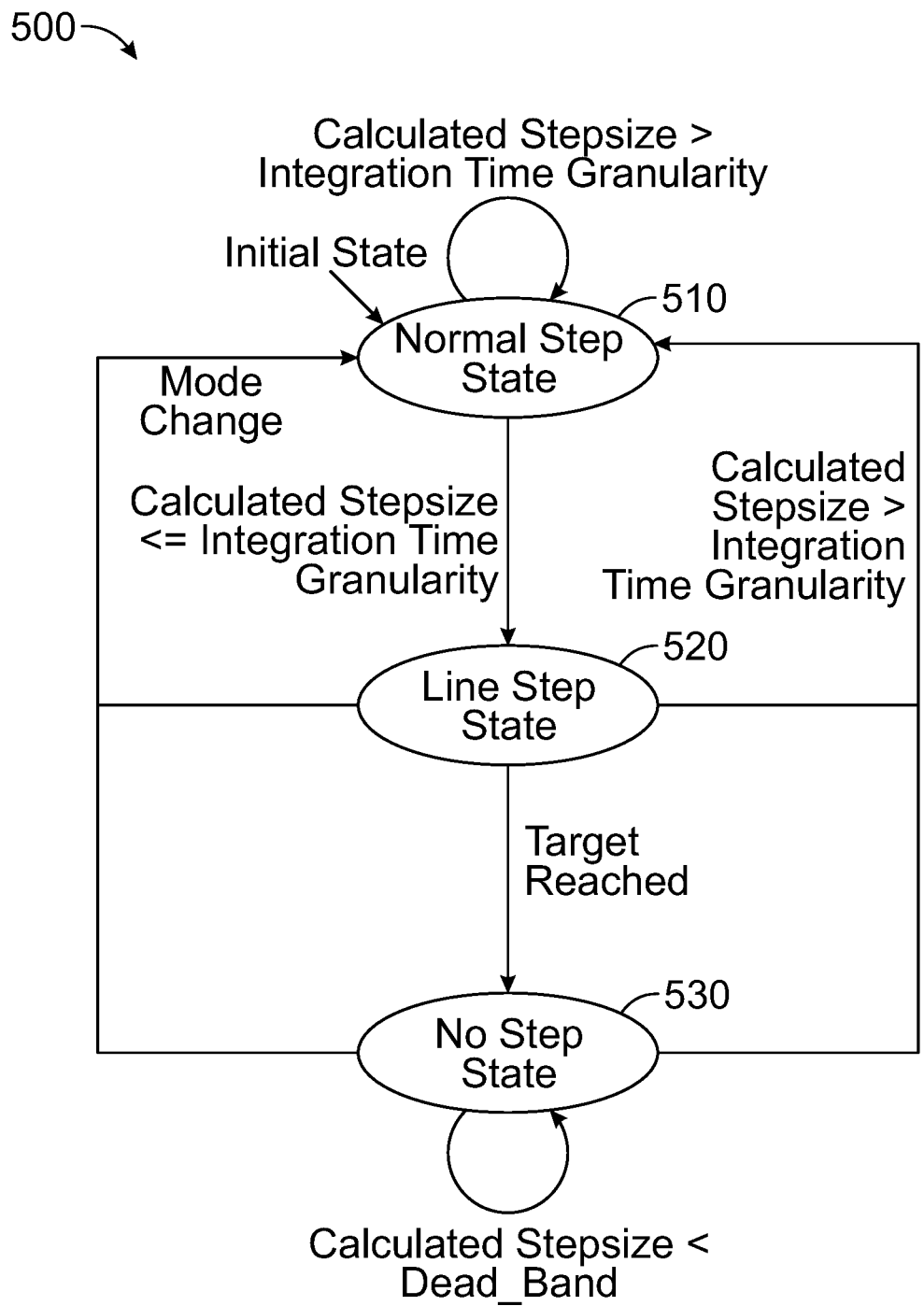
FIG. 5 illustrates an example of a state machine for the operation of a dynamic range controller in accordance with an embodiment of the disclosure.

An embodiment of an AEC state machine 500 in accordance with the present disclosure is illustrated in FIG. 5. In the illustrated embodiment, Mode can be set to either Peak or Average Mode, and the DEAD_BAND is set to approximately +/−100 bin/8, or approximately +/−900-1000 counts. The initial state is the normal step state 510 during which the AEC module adjusts the integration timing to move the image histograms towards a target. When the calculated stepsize is less or equal to an integration time granularity value, machine enters the line step state 520. The granularity of allowed integration time may depend on an operating mode of the SWIR device, such as whether the device is currently doing integrate then read or integrate while read. When the pre-integration time is determined to be greater than or equal to the readout time, then the granularity is effectively turned off by setting it to a "granularity" of one clock. But when the camera is in IWR mode (pre-integration time is determined to be less than the readout time), then the granularity is set to the number of clocks per line (e.g., 180 clocks). If the target is reach, then the machine enters the no step state 530 until the calculated step size is greater than or equal to the DEAD_BAND value.

Figure 6:
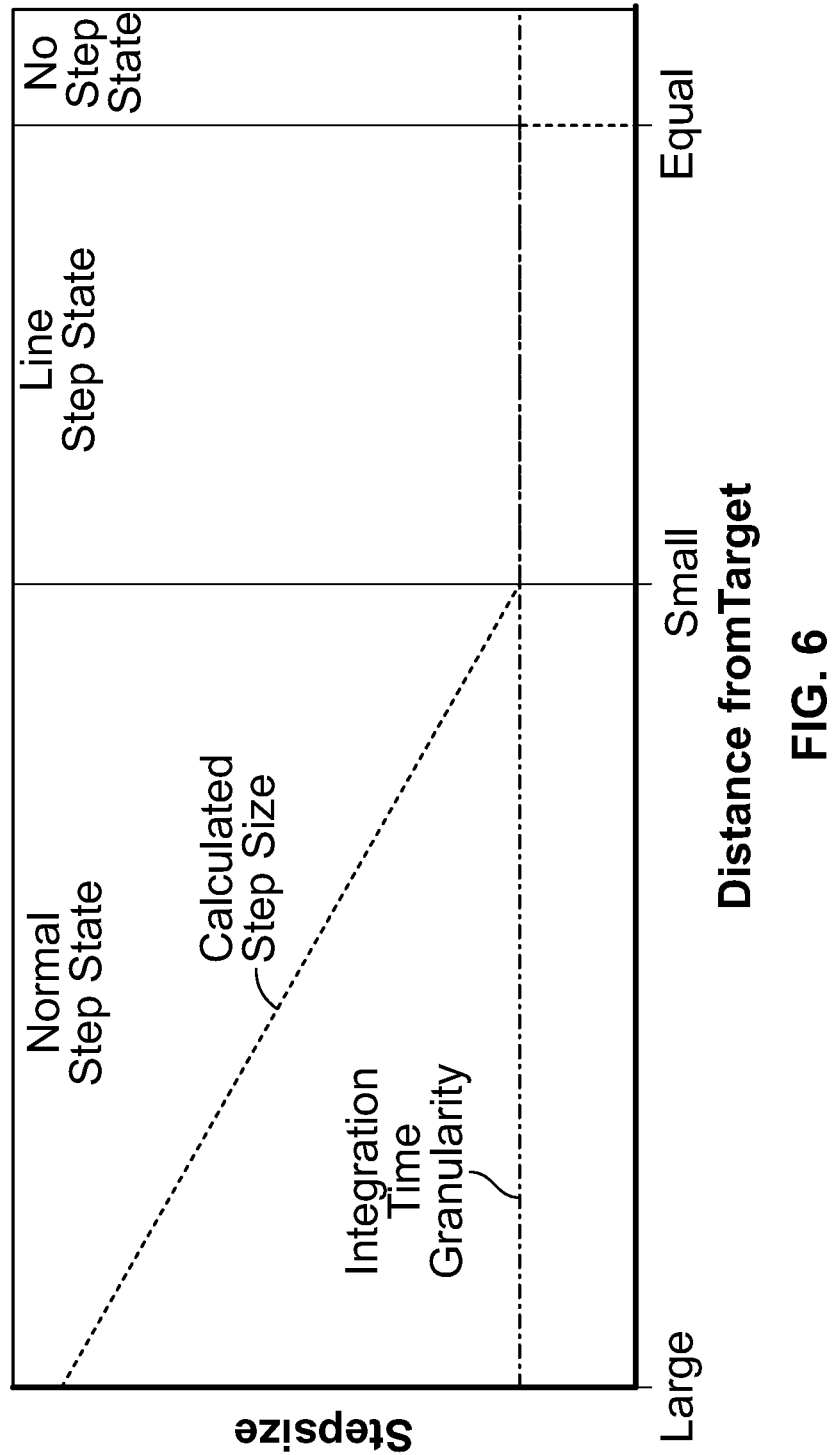
FIG. 6 illustrates an approach of the current integration time to the target value in accordance with an embodiment of the disclosure.

An illustration of the approach of the current integration time to the target value is shown in FIG. 6. If the calculated step-size becomes less than the current image sensor integration time granularity, then the integration time is adjusted by the current image sensor-allowed integration time granularity, until the target value is reached. The target value is reached because the approach in this state is no longer asymptotic. Generally, the algorithm doesn't hit the exact target value.

Figure 7:
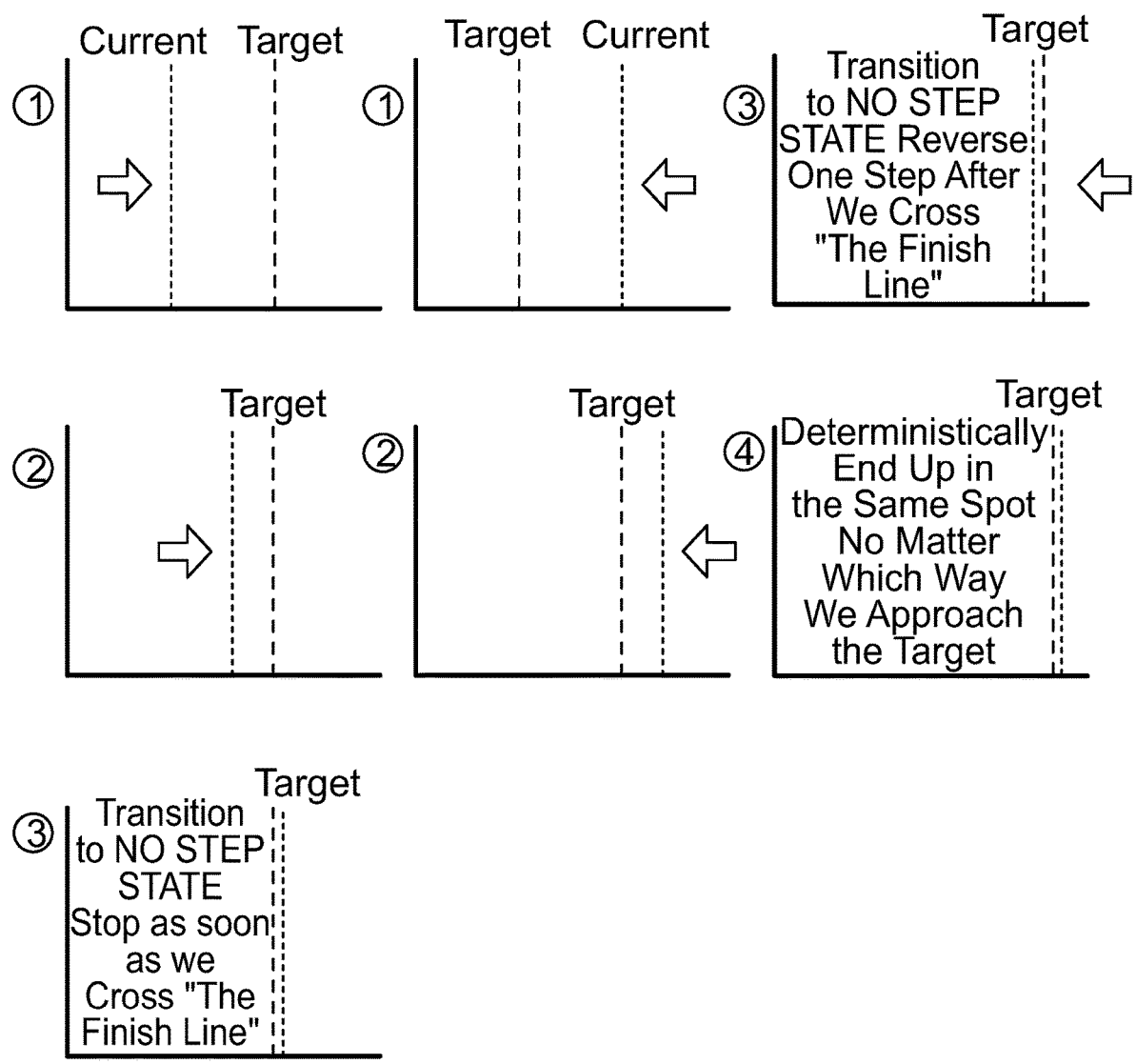
FIG. 7 illustrates an embodiment depicting a scenario where an image histogram approaches an image target in accordance with an embodiment of the disclosure.

Referring to FIG. 7, when the current value approaches the target value from the left, the algorithm considers the target "met" when the current value crosses the target value (becomes greater than or equal to the target value). When the current value approaches the target value from the right, in order to ensure that the algorithm deterministically lands at the same spot for a given target value, when the current value crosses the target value (becomes less than), the algorithm reverses by one step. Finally, in order to eliminate scene flicker, the algorithm will not adjust the scene any further until the calculated step-size becomes greater than the dead-band (approximately +/−900-1000 counts).

Figure 8A:
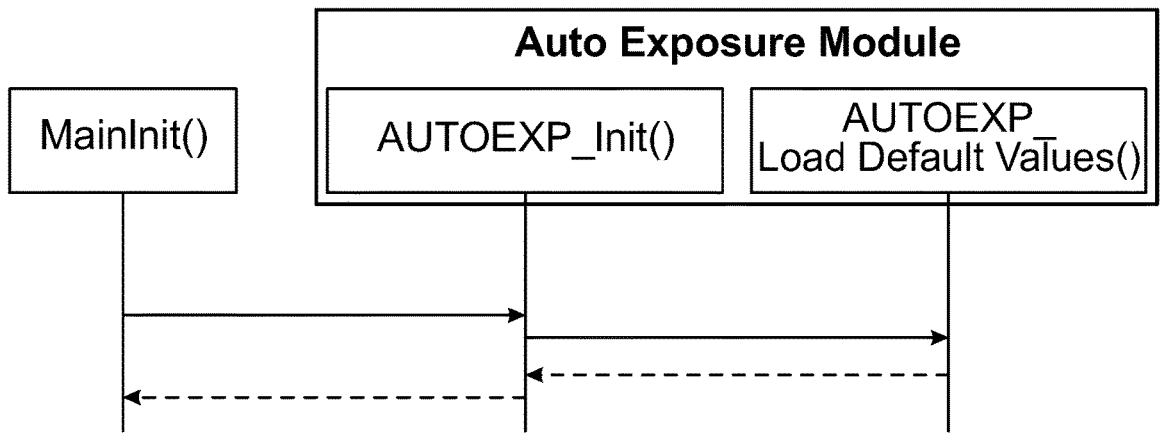
FIGS. 8A-B illustrate an example flow of control of the automatic exposure control in accordance with an embodiment of the disclosure.
Figure 8B:
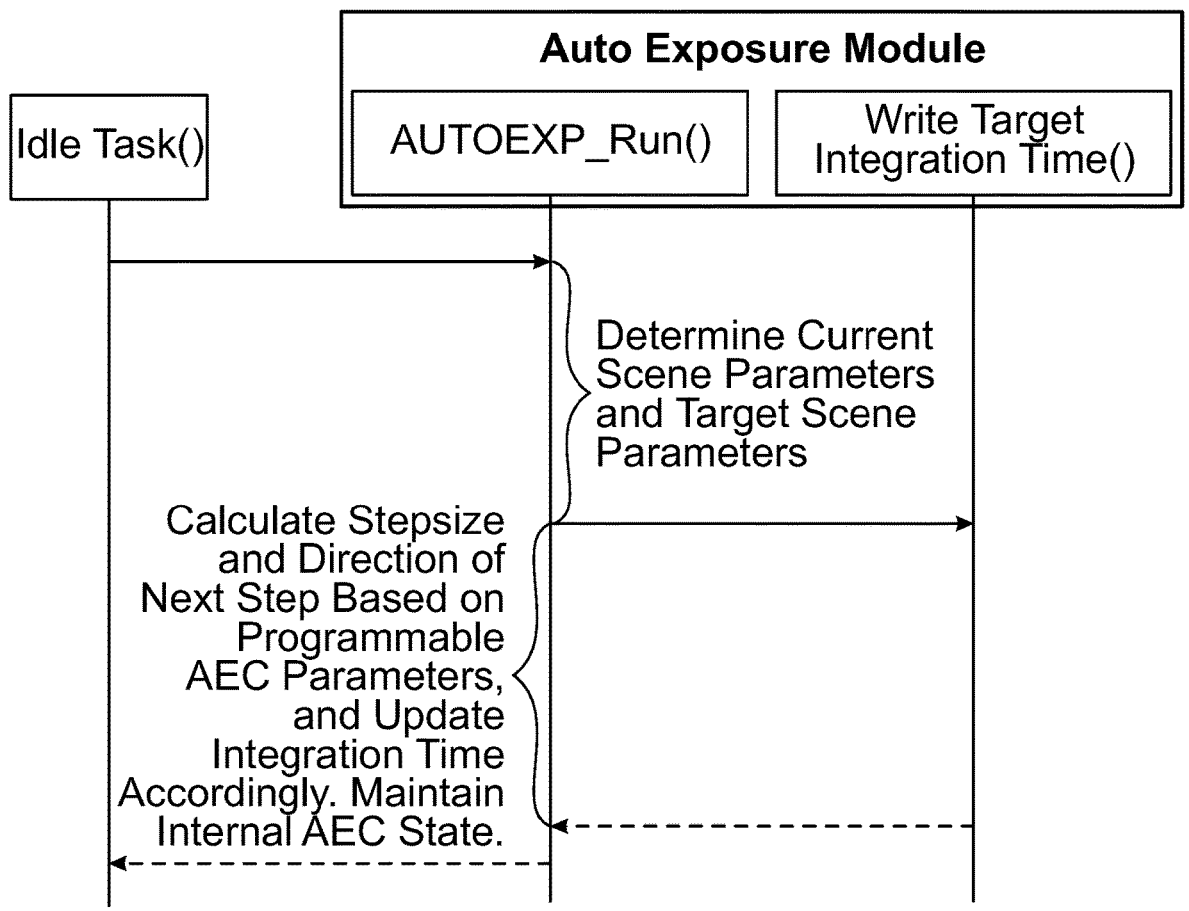

FIGS. 8A-B illustrates an example flow control of the automatic exposure control in accordance with an embodiment of the disclosure. As used in the drawings, a solid line indicates a function call, with the arrowhead indicating the direction of the call, and a dashed line indicates the return from a function call. A return value is optionally indicated where the return value is important to the information being conveyed. Initialization is called, which initializes the AEC module and loads its internal parameters with default values. After the imaging device (e.g., SWIR camera) has been initialized and begins processing video, the execution of the AEC model is performed from an IdleTask logic function as shown in diagram. The auto exposure module determines the current scene parameters and target scene parameters (auto-exp_run( )) and calculates a stepsize and direction of the next step based on programmable AEC parameters. The integration time is updated accordingly.

In various embodiments, the AEC module is controlled by parameters which may include:
  State: Keeps track of whether the AEC Module is currently disabled or enabled.
  Mode: Keeps track of whether the AEC Module is currently operating in "peak" mode or "average" mode. Note that when time the mode is changed, the internal AEC State Machine is reset to the NORMAL_STEP_STATE.
  PercentOfMaxRange: This parameter determines the percentage of the maximum range that determines the target value that the algorithm will shoot for. Note that each mode has its own unique parameter setting.
  MaxPercentChange: This parameter determines the maximum stepsize (in percent) that the algorithm will move the current scene towards the target. Note that each mode has its own unique parameter setting.
  initialized: This flag allows the algorithm to prevent any internal processing to be performed until the AUTO-EXP_Init( ) function has been called.

Gain switch control module parameters are also used in the AEC module operation. In various embodiments, the AEC module is controlled by parameters which may include:
  AECEnable, If AEC is not enabled, then Gain Switch is not active.
  GainSwitchEnable, Gain switch can be enabled/disabled, but it will only be active if AEC is also enabled.
  CurrentGainState. This variable probably already exists somewhere else.
  Switch Up parameters: These parameters determine if sensor gain will switch to a higher state (Low to Medium or Medium to high).
    SwitchUpTint: An integration time input variable in units of percent of frame time.
    SwitchUpNow: A Boolean variable. If IntegratedTint>SwitchUpTint then SwitchUpNow is true
  Switch Down Parameters: These parameter determine if sensor gain will switch to a lower state (High to Medium or Medium to high).
    SwitchDownTint: An integration time input variable in units of percent of frame time.
    SwitchDownNow: A Boolean variable. If IntegratedTint>SwitchDownTint then SwitchDownNow is true.
  Relative gain state parameters: These parameters define the relative sensor gains. Units are multiples of the low gain value. (Typical values shown here are for the 1202 Version 1, Option 2)
    LowGainValue; Programmable with default value 1.4
    MediumGainValue: Programmable with default value 17
    HighGainValue: Programmable with default value 46
  Integration Time Sampling:
    IntegrateSamples: Units number of frames to integrate. The integration time will be integrated (averaged) for this number of frames.
    IntegratedTint: The average Tint over IntegrateSamples of Tint. The decision to change gain state will be based on this value.
  A/D offset: Units percent of the total digital range. The range checking for switching from lower to higher gain states is based on the ratio of relative gain states times the total digital range. There is likely an offset between zero counts and minimum level of the output. This parameter is used to offset the range checking levels.

When the gain switch control module is operating in a high gain mode, then if the integration time is turned down because the light is bright or the dark current is high or the histogram target is low, and the histogram is close to target or the histogram cannot get down to the target and the system has stabilized so the step size is small, then switch down.

When the gain switch control module is operating in a medium gain mode, then if the integration time is turned down because the light is bright or the dark current is high or the histogram target is low, and the histogram is close to target or the histogram cannot get down to the target and the system has stabilized so the stepsize is small, then switch down.

When the gain switch control module is operating in a medium gain mode, then if the integration time is turned up because the light is dim and the dark current is low and the histogram target is high, and the system has stabilized so the histogram is close to target or cannot get up to the target, then switch up, unless the histogram bin is greater than ⅓ of the range because high gain range is ⅓ of the medium gain range.

When the gain switch control module is operating in a low gain mode, then if the integration time is turned up because the light is dim and the dark current is low and the histogram target is high, and the system has stabilized so the histogram is close to target or cannot get up to the target, then switch up, unless the histogram bin is greater than 1/12 of the range because medium gain range is 1/12 of the low gain range.

The large difference between gain states may result in bright jumps when the gain switches up, and dark jumps when the gain switches down. The jump will exist until the AEC function corrects the integration time. In Automatic Gain Switch mode the expected integration time in the new gain state can be predicted based on the gain ratio from the old gain state. A predictive tint adjustment function performs a onetime tint adjustment directly after the gain switch, then lets the AEC module complete the integration time tuning. In one embodiment, the new tint value equals the old tint value times a ratio between the current state and next state values.

In various embodiments, the image sensor produces a 14-bit output and has several offsets. For example, the output of the FPA may have a range from 3.0V at starvation to 1.0V at saturation. The saturation level tends to be constant, but the starvation will vary slightly with gain state, and skim voltage setting. The A/D converter is configured to digitize 3.2V, slightly more than the actual voltage swing. The center of the A/D range is also connected to a programmable voltage nominally set to 2.0V. There is also some dark current in the detector which varies with detector temperature. The result is the minimum counts output by the camera in the dark at minimum integration time is greater than zero. The table switch level checking test should use an offset variable to account for this fixed offset.

Embodiments of the operation of the AEC module will now be further described with reference to FIGS. 9A-D. Traditional sensors relied on 2-point non-uniformity correction to provide pixel normalized video. This mode has some limitations: (i) fixed integration period (exposure period) per non-uniformity correction (NUC) table; (ii) NUC table accounts for non-scene related artifacts such as ROIC offset per pixel and dark currents of the detector; and (iii) limited intrascene dynamic range due to limitation imposed by (i) and limited well capacity of each pixel unit cell.

Figure 9A:
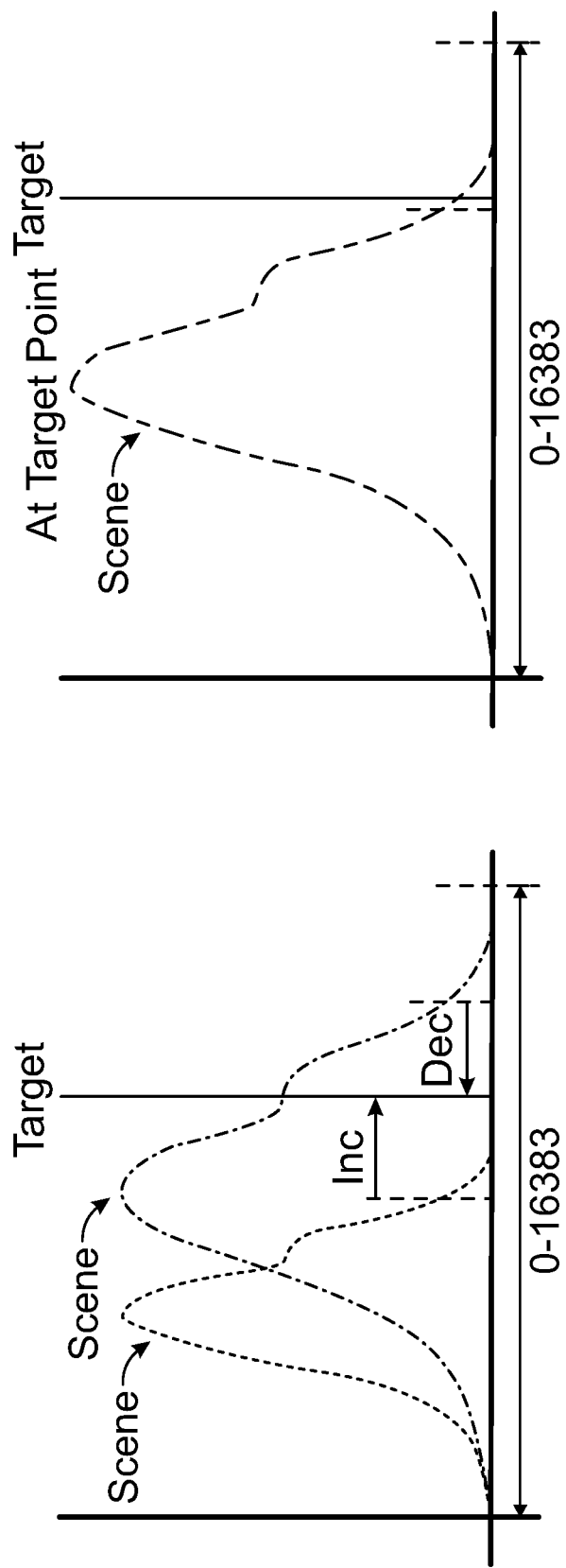
FIGS. 9A-D illustrate example operation of an AEC module in accordance with embodiments of the disclosure.

Automatic Exposure Control (AEC) allows dynamic adjustment of intrascene range while maintaining "acceptable" level of video fidelity. AEC alters the integration period (exposure) to maintain intrascene end-to-end range at a predefined range of the sensor's electrical output range without switching NUC tables. A graphical representation of scene dynamic range with respect to sensor dynamic range is shown in FIG. 9A. The graph on the left side represents two opposite conditions; scene range as collected by the sensor is less than ideal size (red) and the scene range is larger than the ideal size (in dotted blue). Increasing the exposure control (for red) and decreasing exposure control (for blue) will eventually converge to the optimized condition as shown in the right side graph.

Figure 9B:
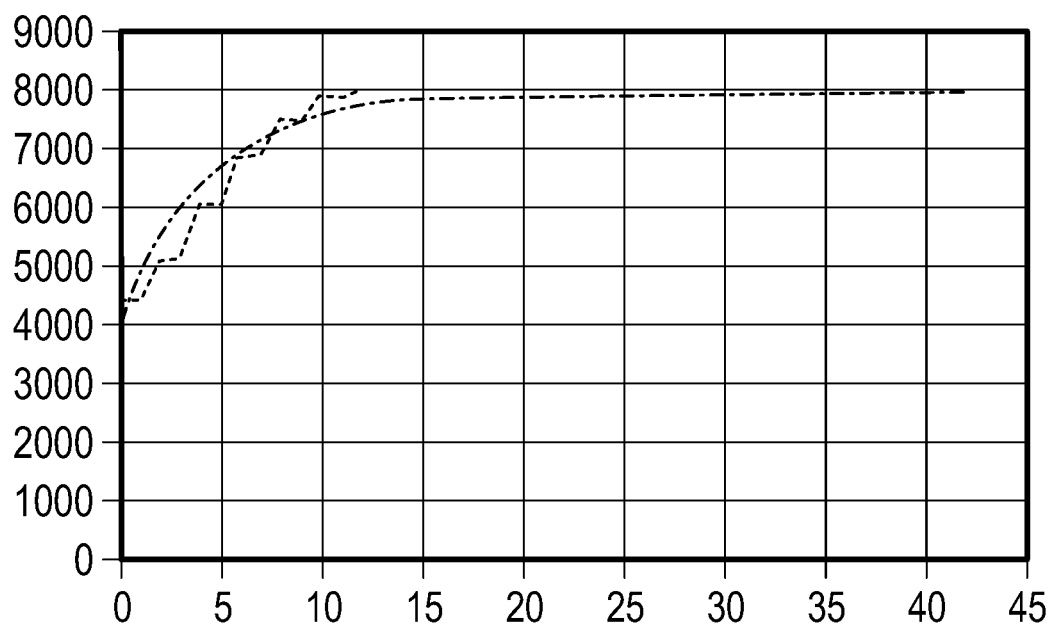

Two parameters for AEC are the target value and step size; both in percentage. Target value is in percentage of the sensor digital dynamic range. In one embodiment, this is percentage of 16383 or 14 bits. Step size is the change in exposure period based on the error (peak to target) times the step size. Using a "step size" multiplier ensures over or critically dampen convergence to the Target Value. The graph of FIG. 9B shows simulation (blue) and actual data (brown) of the AEC response to ~50% reduction in scene brightness with "Step Size" set to 20%.

Figure 9C:
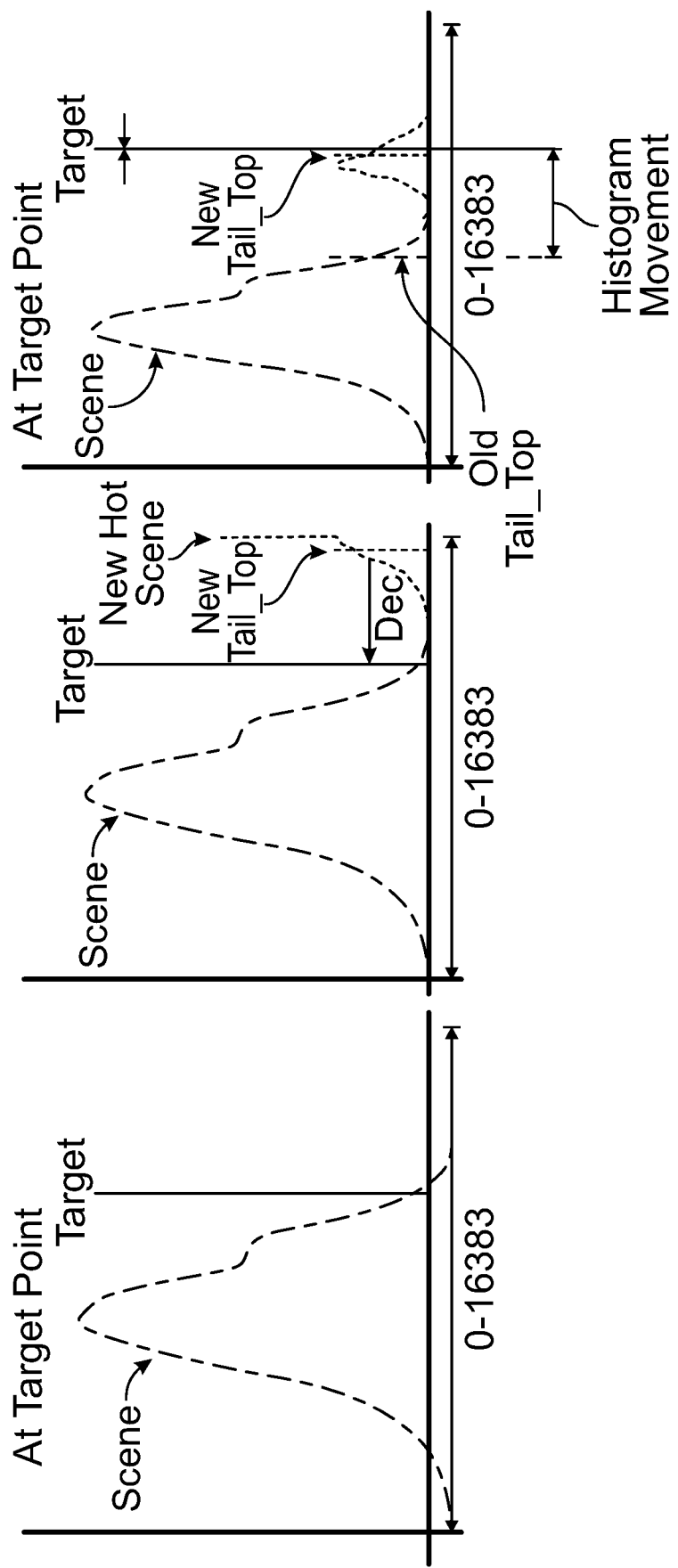
Figure 9D:
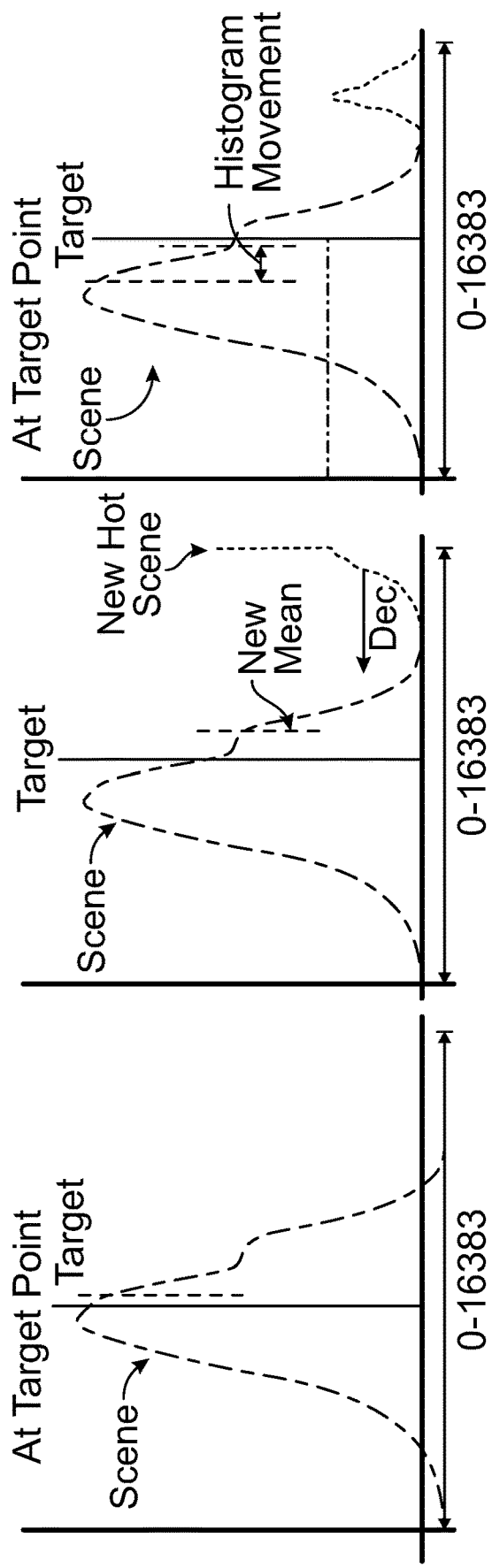

Response to an over-bright scene is shown in the graphs of FIG. 9C. The left most graph is steady state condition for the sensor. The middle graph shows that some of the pixels are "seeing" something very bright and the new histogram graph is shown with the bright population shown in red line. With the new population distribution, Tail_Top has moved away from the target value and is reporting much higher value (dotted red vertical line vs previous tail top shown in green dotted vertical line). In response to new distribution, AEC will initiate reducing the exposure period to bring Tail_Top to the Target value. The right most graph shows the steady state condition for the new scene with over-bright pixels. As can be seen by the graph, the initial steady state population is now moved to the left, making these pixels much darker and in some conditions loses their video grey scale and most scene may be shown as just "black". However the new over-bright pixels will use many of the video grey scale so that the bright pixels will show some details.

The above example is peak-AEC where the top (peak value) of the histogram bin is adjusted to equal the target value. Mean-AEC uses the array mean to equate to the target; graphical representation is shown below. Similar response except that the mean value does not vary as much as peak. In this mode, it will preserve the bulk of the grey scale to the original population and as a result renders the over-bright pixels as one bright shade of grey with no details. In either case, due to degradation in the sensor uniformity, the usable limit is from ½X to 2X of the integration period used to generate the NUC coefficients (NUC table).

Figure 10:
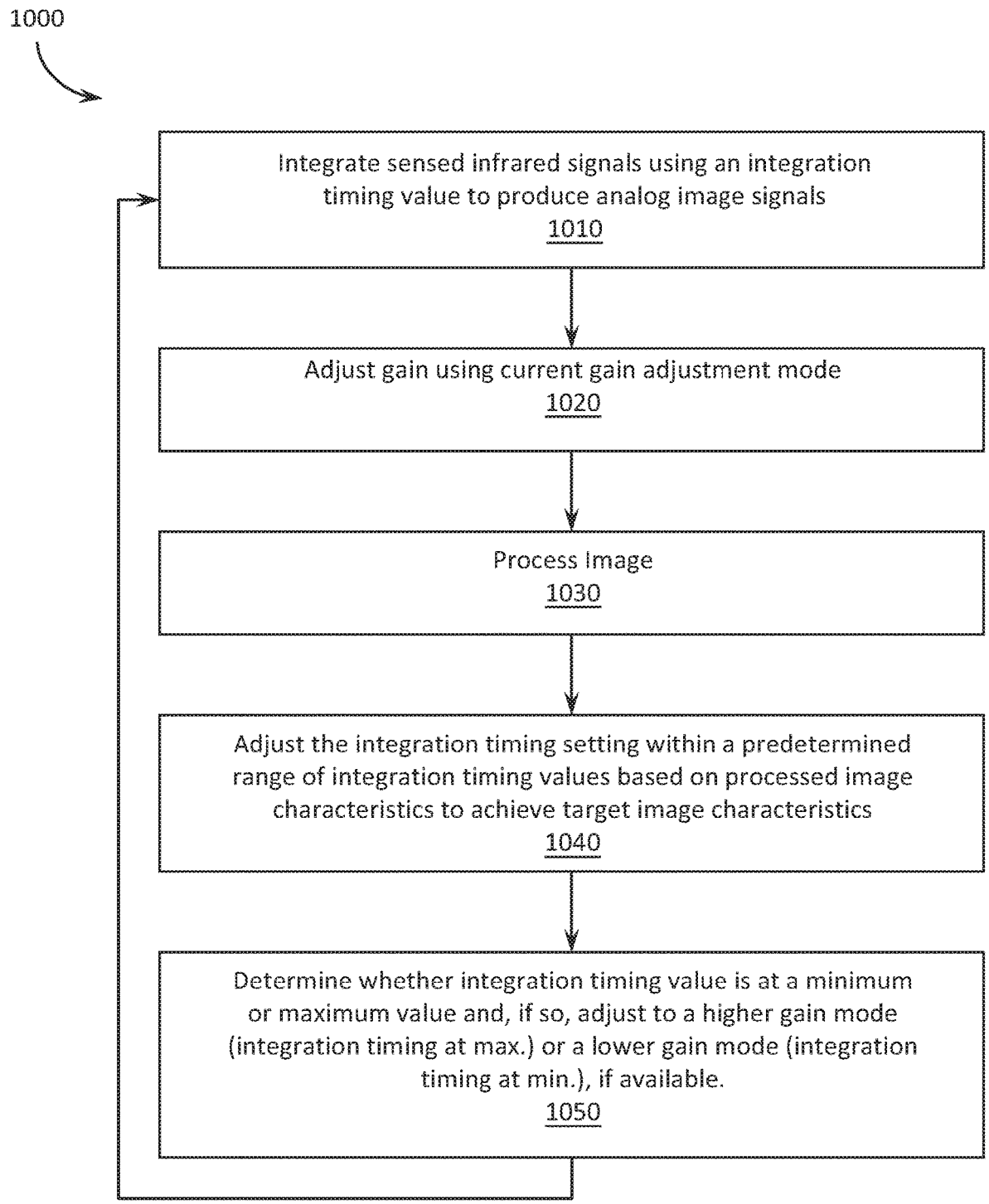
FIG. 10 is a flow diagram illustrating an example process for operating an image sensor in accordance with embodiments of the disclosure.

Referring to FIG. 10, an example process 1000 for operating an image sensor in accordance with embodiments of the disclosure will now be described. In step 1010, infrared radiation received by an array of infrared sensors is integrated in accordance with a current integrations timing setting to produce analog image signals. The analog image signals are then gain adjusted in step 1020 using a current gain mode. The image is processed in step 1030 to produce a desired image signal. Image characteristics are calculated from the processed image signal and fed back to a dynamic range compensation controller for automatic exposure and gain control. In step 1040, the integration timing setting is adjusted, as needed, within a predetermined range of integration timing values based on processed image characteristics to achieve target image characteristics. If the integration timing setting is at a minimum or maximum value within the range of available integration timing values, then the gain mode is adjusted to a higher gain mode (integration timing at maximum value) or lower gain mode (integration timing at minimum value). Images are then captured and processed using the new integration and gain settings.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A system comprising:
an image sensor comprising:
an array of infrared sensors operable to capture an image of a scene;
an integration timing circuit variably controlling an integration time of the infrared sensors;
a readout integrated circuit (ROTC) operable to generate signals from the infrared sensors corresponding to the captured image of the scene;
an automatic gain controller operable to apply a gain to the generated signals; and
a dynamic range compensation controller operable to:
(i) receive image characteristics corresponding to the generated signals,
(ii) compare the received image characteristics to target image characteristics,
(iii) adjust an integration timing signal for controlling the integration timing circuit to adjust the integration time to improve alignment of the received image characteristics with the target image characteristics without the dynamic range compensation controller signaling the automatic gain controller to change gain control operation,
(iv) determine, based at least in part on the adjusted integration time in (iii) and the improved alignment in (iii), whether the improved alignment in (iii) is to be further improved by generating a gain control signal for controlling the automatic gain controller, and
(v) responsive to determining, in (iv), that the improved alignment is to be further improved, generate the gain control signal for controlling the automatic gain controller based at least in part on the adjusted integration time to further improve the alignment.

2. The system of claim 1 wherein the image sensor is a short wave infrared image sensor; and
operation (v) further comprises additionally adjusting the integration time to reduce an image brightness jump associated with a gain change caused by the gain control signal in (v).

3. The system of claim 1 wherein the image characteristics comprise a received image histogram and a target image histogram and wherein the dynamic range compensation controller is operable to adjust the integration timing signal to improve alignment of the received image histogram to the target image histogram.

4. The system of claim 3 wherein the dynamic range compensation controller includes a peak mode wherein the received image histogram is adjusted to improve alignment of a top of the received image histogram with a top of the target histogram.

5. The system of claim 3 wherein the dynamic range compensation controller includes an average mode wherein the received image histogram is adjusted to improve alignment of a mean of the received image histogram with a mean of the target histogram.

6. The system of claim 1 wherein the dynamic range compensation controller comprises an automatic exposure control (AEC) module operable to adjust the integration timing signal, and a gain control module operable to generate the gain control signal for controlling the automatic gain controller.

7. The system of claim 6 wherein the AEC module is further operable to detect whether the integration timing signal is equal to or below a minimum integration threshold, and wherein the gain control module is operable to adjust the gain control signal to an available lower gain mode if the image characteristics and the target image characteristic are not aligned.

8. The system of claim 6 wherein the AEC module is further operable to detect whether the integration timing signal is equal to or above a maximum integration threshold, and wherein the gain control module is operable to adjust the gain control signal to a higher gain mode when the image characteristics and the target image characteristic are not aligned.

9. The system of claim 1 wherein the dynamic range compensation controller is further operable, in (iii), to calculate a step size based on the comparison between the received image characteristics and the target image characteristics and wherein the integration timing signal is adjusted by applying the step size to a current integration timing signal;
wherein the step size is smaller than a difference between the received image characteristics and the target image characteristics, and the dynamic range compensation controller is operable to perform operation (iii) multiple times with gradually decreasing step sizes, and to perform operations (iv) and (v) only after the integration time has stabilized.

10. The system of claim 1 wherein the dynamic range compensation controller comprises a state machine operable to perform automatic exposure control.

11. A method comprising:
capturing an image of a scene using an array of infrared sensors;
variably controlling an integration time of the infrared sensors using an integration timing circuit;
generating signals from the infrared sensors corresponding to the captured image of the scene using a readout integrated circuit (ROTC);
applying a gain to the generated signals, using an automatic gain controller; and
compensating for a dynamic range of the image using a dynamic range controller, including:
(i) receiving image characteristics corresponding to the generated signals,
(ii) comparing the received image characteristics to target image characteristics,
(iii) generating an integration timing signal for controlling the integration timing circuit to adjust the integration time to improve alignment of the received image characteristics with the target image characteristics without the dynamic range compensation controller signaling the automatic gain controller to change gain control operation,
(iv) determining, based at least in part on the adjusted integration time in (iii) and the improved alignment in (iii), whether the improved alignment in (iii) is to be further improved by generating a gain control signal for controlling the automatic gain controller, and
(v) responsive to determining, in (iv), that the improved alignment is to be further improved, generating the gain control signal for controlling the automatic gain controller based at least in part on the adjusted integration time to further improve the alignment.

12. The method of claim 11 wherein the array of infrared sensors comprises an array of short wave infrared image sensors; and operation (v) further comprises additionally adjusting the integration time to reduce an image brightness jump associated with a gain change caused by the gain control signal in (v).

13. The method of claim 11 wherein the image characteristics comprise a received image histogram and a target image histogram and wherein the method further comprises adjusting the integration timing signal to improve alignment of the received image histogram to the target image histogram.

14. The method of claim 13 wherein the adjusting the integration timing signal comprises operating in a peak mode wherein the received image histogram is adjusted to improve alignment of a top of the received image histogram with a top of the target histogram.

15. The method of claim 13 wherein the adjusting the integration timing signal comprises operating in an average mode wherein the received image histogram is adjusted to improve alignment of a mean of the received image histogram with a mean of the target histogram.

16. The method of claim 11 further comprising adjusting the integration timing signal using an automatic exposure control (AEC) module, and generating the gain control signal for controlling the automatic gain controller.

17. The method of claim 16 further comprising detecting whether the integration timing signal is equal to or below a minimum integration threshold, and adjusting the gain control signal to an available lower gain mode if the received image characteristics and the target image characteristic are not aligned.

18. The method of claim 16 further comprising detecting whether the integration timing signal is equal to or above a maximum integration threshold, and adjusting the gain control signal to a higher gain mode when the image characteristics and the target image characteristic are not aligned.

19. The method of claim 11 further comprising, in (iii), calculating a step size based on the comparison between the received image characteristics and the target image characteristics and adjusting the integration timing signal by applying the step size to a current integration timing signal;
wherein the step size is smaller than a difference between the received image characteristics and the target image characteristics, and the dynamic range controller is operable to perform operation (iii) multiple times with gradually decreasing step sizes, and to perform operations (iv) and (v) only after the integration time has stabilized.

20. The method of claim 11 further comprising operating a state machine to perform automatic exposure control.

* * * * *

UNITED STATES PATENT AND TRADEMARK OFFICE
CERTIFICATE OF CORRECTION

PATENT NO. : 10,965,894 B2
APPLICATION NO. : 16/182504
DATED : March 30, 2021
INVENTOR(S) : Devin T. Walsh et al.

Page 1 of 1

It is certified that error appears in the above-identified patent and that said Letters Patent is hereby corrected as shown below:

In the Claims

In Column 15, Line 10, change "ROTC" to -- ROIC --

In Column 16, Line 38, change "ROTC" to -- ROIC --

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*